(12) United States Patent
Jones et al.

(10) Patent No.: US 6,259,418 B1
(45) Date of Patent: Jul. 10, 2001

(54) MODIFIED MONOPOLE ANTENNA

(75) Inventors: Jeffrey L. Jones, Orem; Sy Prestwich, West Jordan; David Andrus, Provo, all of UT (US)

(73) Assignee: 3Com Corp., Santa Clara, CA (US)

( * ) Notice: Subject to any disclaimer, the term of this patent is extended or adjusted under 35 U.S.C. 154(b) by 0 days.

(21) Appl. No.: 09/488,670

(22) Filed: Jan. 20, 2000

(51) Int. Cl.⁷ .................................................. H01Q 1/48
(52) U.S. Cl. ............................................. 343/846; 343/702
(58) Field of Search ............................ 343/846, 700 MS, 343/702, 715, 749, 872, 757, 713, 873, 882, 906

(56) References Cited

U.S. PATENT DOCUMENTS

| | | | |
|---|---|---|---|
| 5,565,877 | * 10/1996 | Du et al. | 343/715 |
| 5,646,635 | * 7/1997 | Cockson et al. | 343/702 |
| 5,933,116 | 8/1999 | Suesada et al. | 343/702 |
| 5,949,379 | * 9/1999 | Yang | 343/702 |
| 5,973,652 | 10/1999 | Sanford et al. | 343/781 |
| 6,054,955 | * 4/2000 | Schlegel, Jr. et al. | 343/702 |

* cited by examiner

*Primary Examiner*—Don Wong
*Assistant Examiner*—Chuc D Tran
(74) *Attorney, Agent, or Firm*—Kirton McConkie; Michael F. Krieger

(57) ABSTRACT

The present invention relates to a compact antenna for use with small, wireless, electronic devices. The antenna is particularly suited for adaptation to thin profile expansion cards such as the PC Card standard card as well as other thin form factor devices. This antenna comprises a ground plane element from which a radiator element protrudes. When the ground plane element occupies a substantially horizontal plane, the radiator element extends upwardly from a centralized location on the ground plane element and bends away from the device in which the antenna is used. The radiator may then bend back to a more vertical orientation in some embodiments. The shape of the radiator element allows the antenna to be retracted into a host device while minimizing the amount of space required to house the antenna in the device. Particular embodiments of the present invention comprise hinging mechanisms to make the antenna more compact and switching mechanisms for automatic activation of wireless functionality when the antenna is deployed.

17 Claims, 5 Drawing Sheets

MODIFIED MONOPOLE ANTENNA

THE FIELD OF THE INVENTION

The present invention relates to compact antennas used in restricted profile, wireless electronic devices. More particularly, the present invention relates to an antenna with a novel geometric configuration which improves performance and conserves space in its host device. The antenna of the present invention comprises a radiator with unique reverse curvature that allows the radiator to emanate from a central position on a ground plane element and be redirected to a position distal to the host device.

BACKGROUND

Wireless communication devices are now becoming commonplace in the electronics industry. Wireless networking of portable computers and associated devices is now replacing a large segment of the networking market. Wireless communication devices including wireless networking adapters, hubs and other equipment utilize radio transmitters and receivers to transmit data signals from one device or node to another. These radio transmitters and receivers must utilize a specific frequency band and protocol to accomplish this task. Since these wireless networks and communications areas may often overlap, standards, protocols and privacy protection are necessary. One current standard in the industry has been established by the Institute of Electrical and Electronics Engineers, Inc. (IEEE) and is known as IEEE 802.11. This standard comprises communications standards, protocol and equipment specifications for wireless communication equipment including privacy and encryption provisions.

Another emerging standard in wireless communications and networking, known as Bluetooth® is being established by a collaborative group of communications and computing companies. Devices incorporating Bluetooth® technology will utilize a micro-chip transceiver for communications between devices. Bluetooth® devices will transmit in the previously unused 2.4 GHz range. Bluetooth® technology promises to be a viable and economical networking solution for interconnection of cell phones, computers, printers, modems, computer peripherals, fax machines and other communications and computing devices. The size of the Bluetooth® transceiver will make it usable in devices as small as palm computers and cell phones.

Antennas are well known for enabling and improving transmission to radio receivers and from radio transmitters. Antennas can dramatically increase the range of radio transceivers, however most antenna designs function best when protruding from their host device. In small electronic devices protruding antennas are often vulnerable to breakage as the devices are often stowed in purses, pockets, backpacks and other areas where neglect can occur. A retractable or otherwise deployable antenna is more convenient and durable and occupies less space when retracted.

Known monopole antennas perform optimally when they can radiate against a ground plane. Performance is further enhanced when these antennas extend substantially perpendicularly from a central location on a ground plane. However, retractable monopole antennas that are centrally located on a ground plane often occupy a relatively large amount of space when the centrally located antenna and ground plane are retracted into a host device.

SUMMARY AND OBJECTS OF THE INVENTION

The present invention relates to antennas with a novel radiator geometry which allows the radiator to protrude from a substantially central location on a ground plane while minimizing the space occupied by the antenna when it is retracted or stowed. This configuration occupies less space in a host device when the antenna is retracted while providing performance similar to an antenna with a fixed, perpendicular radiator protruding from a ground plane.

Wireless communications devices are becoming extremely common especially in the fields of telephone communications and computer network communications. Wireless local area networks (LAN's) and even wide area networks (WAN's) are now widespread. Keeping with the pace of technology, wireless communications devices are also becoming smaller and more compact to increase convenience and lower costs. As wireless devices become more compact, the need for compact, retractable antennas increases.

Some wireless protocols involve the use of relatively low power transceivers which have a limited range. Devices which operate within these protocols are often small portable devices which are powered by batteries or low power sources. Components for these devices must be very efficient with very little losses so that range can be maximized with limited power.

Some embodiments of the present invention comprise a retractable extension used in conjunction with a wireless communications device. The extension comprises a ground plane from which an antenna radiator extends. The antenna radiator may be of a deployable type which hinges or otherwise deploys into a position of optimal performance. In preferred embodiments the extension is extended from the device and the antenna radiator is hinged into a substantially vertical position. When the radiator is stowed and the extension retracted, the antenna radiator and extension may fit within the form factor of the device.

Because the entire radiator and extension, including the ground plane, must fit within the device, it is desirable to have a radiator which will minimize the area occupied within the device. This is achieved with the use of a radiator which extends substantially perpendicularly from a substantially centralized location on a ground plane and which subsequently bends outwardly toward the outward end of the ground plane and extension. Preferred embodiments may also bend back toward a substantially vertical position near the tip of the radiator.

Some embodiments of the present invention comprise hinges or other movable parts which may be used to deploy the antenna from a retracted, folded or stowed position to a position that will improve reception and performance. For example, and not by way of limitation, an antenna may hinge from a position which fully or partially falls within the form factor of relatively flat extension to an upright position for improved performance.

Some embodiments of the present invention may also comprise switching circuitry which automatically activates a wireless device when the antenna is deployed. For example, and not by way of limitation, a combination wireless network adapter and wired network adapter may be contained in a single expansion card. When the antenna is deployed, the circuitry automatically activates the wireless adapter and when the antenna is stowed, the wired adapter is activated. The same principle may be used for a wired/wireless modem combination or a simple wireless device may activate and access a wireless network when the antenna is deployed.

Accordingly, it is an object of some embodiments of the present invention to provide an antenna which can be combined with thin profile devices without substantially increasing space requirements.

These and other objects and features of the present invention will become more fully apparent from the following, description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The figures listed above are expressly incorporated as part of this detailed description.

It will be readily understood that the components of the present invention, as generally described and illustrated in the figures herein, could be arranged and designed in a wide variety of different configurations. Thus, the following more detailed description of the embodiments of the system and apparatus of the present invention, as represented in FIGS. 3 through 6, is not intended to limit the scope of the invention, as claimed, but it is merely representative of the presently preferred embodiments of the invention.

The currently preferred embodiments of the present invention will be best understood by reference to the drawings, wherein like parts are designated by like numerals throughout.

The Personal Computer Memory Card International Association (PCMCIA) promulgates the PC Card Standard for thin profile or thin architecture expansion cards for electronic devices. The PC Card standard designates the physical dimensions of the cards as well as the electrical configuration of the cards including the 68-pin interface between the card and the host device. The physical dimensions of cards conforming to this standard are 85.6 mm in length by 54.0 mm in width. Several thickness variations fall within the standard and are designated by type designation. Type I, II, and III PC Cards have thicknesses of 3.3 mm, 5.0 mm and 10.5 mm respectively. Any references to the PC Card Standard or PCMCIA card standard refer to electronic cards substantially conforming to this standard as described herein.

Performance of the modified monopole antenna of embodiments of the present invention increases drastically when the antenna radiator can radiate against a ground plane. The ground plane typically comprises an electrically conductive element adjacent to the antenna radiator. The antenna radiator often extends substantially vertically from a ground plane that may be formed in almost any shape, but which often projects outwardly from the radiator base. Optimal performance is typically achieved when the antenna radiator extends from a location near the center of the ground plane. A larger ground plane will also improve performance.

Antenna performance is also affected by interference from the host electronic device as well as other sources. Typical monopole antenna performance increases when the antenna is moved away from the interference of the host device. Therefore, an antenna that is more distant from a host device will achieve increased performance.

Figure 1:
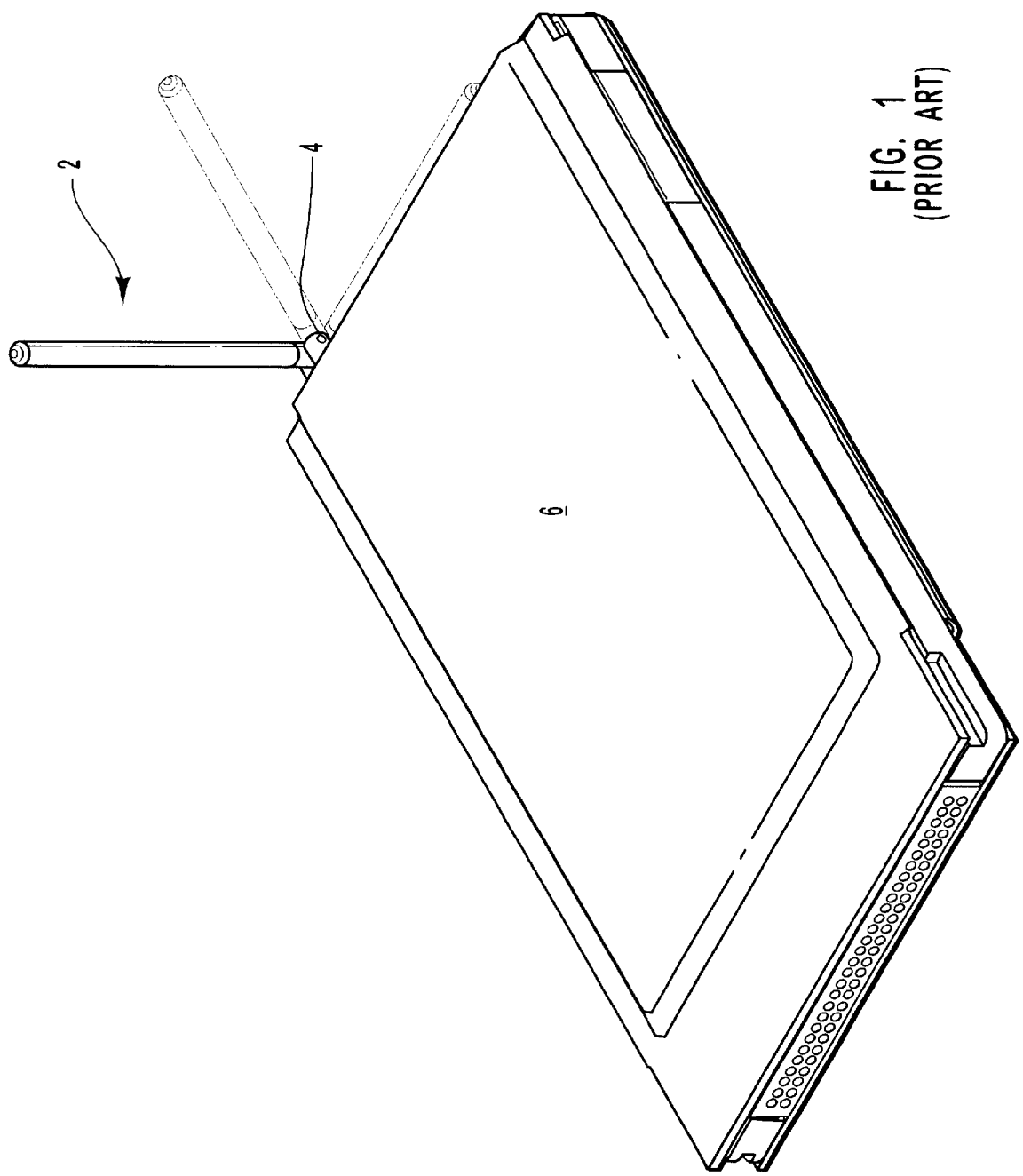
FIG. 1 is a perspective view of a prior art antenna.

Many wireless electronic devices have external antennas which protrude from the devices. These antennas themselves are often telescopic or otherwise retractable to minimize occupied space when not in use. However, they are generally mounted such that they extend from an edge of the host device. In reference to FIG. 1, a prior art antenna 2 protrudes from an electronic device 6. Antenna 2 may have a hinge 4 which allows orientation adjustment or retraction of antenna 2. The edge location of antenna 2 precludes the optimal use of a ground plane centrally located at the base of antenna 2 because device 6 only extends to one side of antenna 2. Consequently, performance of monopole antenna 2 will suffer due to inadequate ground plane or non-optimal ground plane location. These ground plane conditions decrease signal strength and range in wireless devices.

Figure 2A:
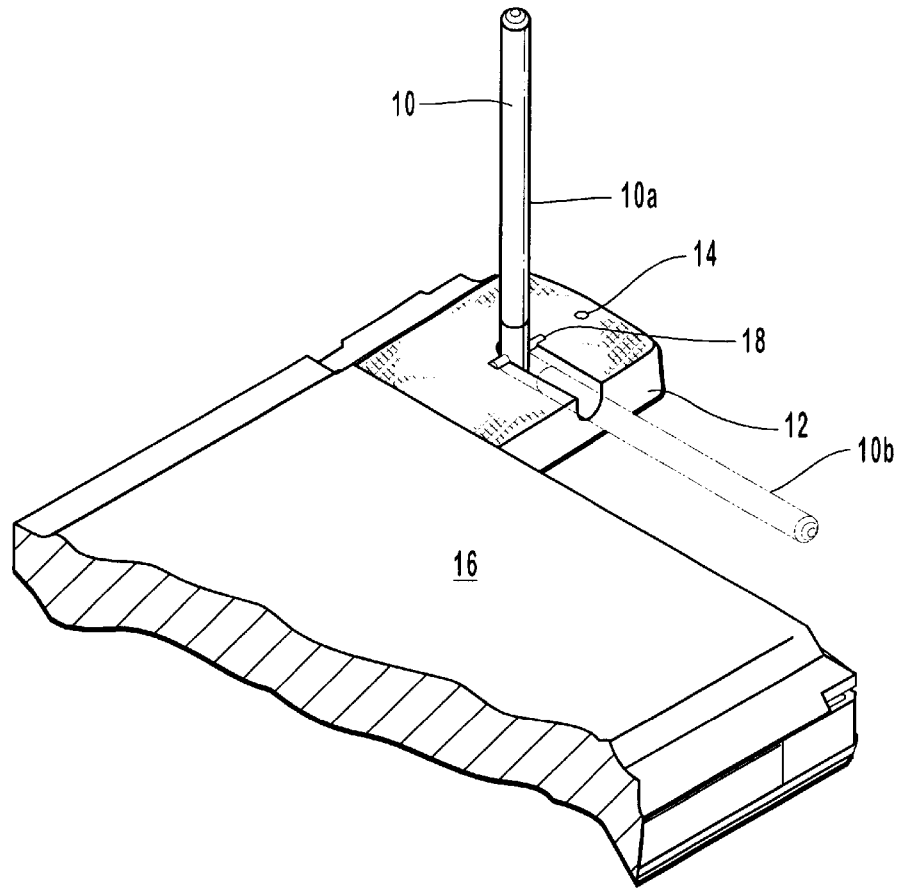
FIG. 2A is a perspective view of a geometrically linear antenna mounted near the center of an extension having a ground plane element while the extension is extended.

In reference to FIG. 2A, an antenna 10 may be located on a retractable extension 12 having a ground plane element 14 located therein. This configuration allows antenna 10 to be located near the center of ground plane element 14 where it may radiate optimally. However, antenna 10 remains in close proximity to host electronic device 16 throughout its entire length and its performance may suffer from interference from device 16.

Figure 2B:
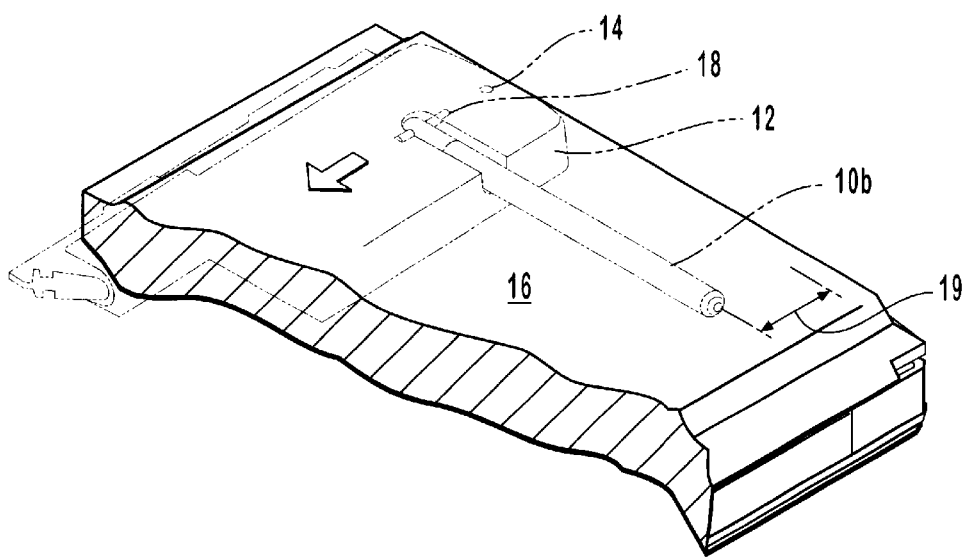
FIG. 2B is a perspective view of a geometrically linear antenna mounted near the center of an extension having a ground plane element while the extension is retracted.

As shown in FIG. 2B, antenna 10 and retractable extension 12 may be retracted into device 16 when not in use. Antenna 10 may be folded along hinge 18 from a substantially vertical, usable position 10a to substantially horizontal, storage position 10b. Once placed in storage position 10b, antenna 10 may be retracted into device 16 along with extension 12. When antenna 10 is retracted into device 16, as shown in FIG. 2B, however, it will occupy a large amount of space 20 that might otherwise be used for electronic componentry or other functionality.

Figure 3:
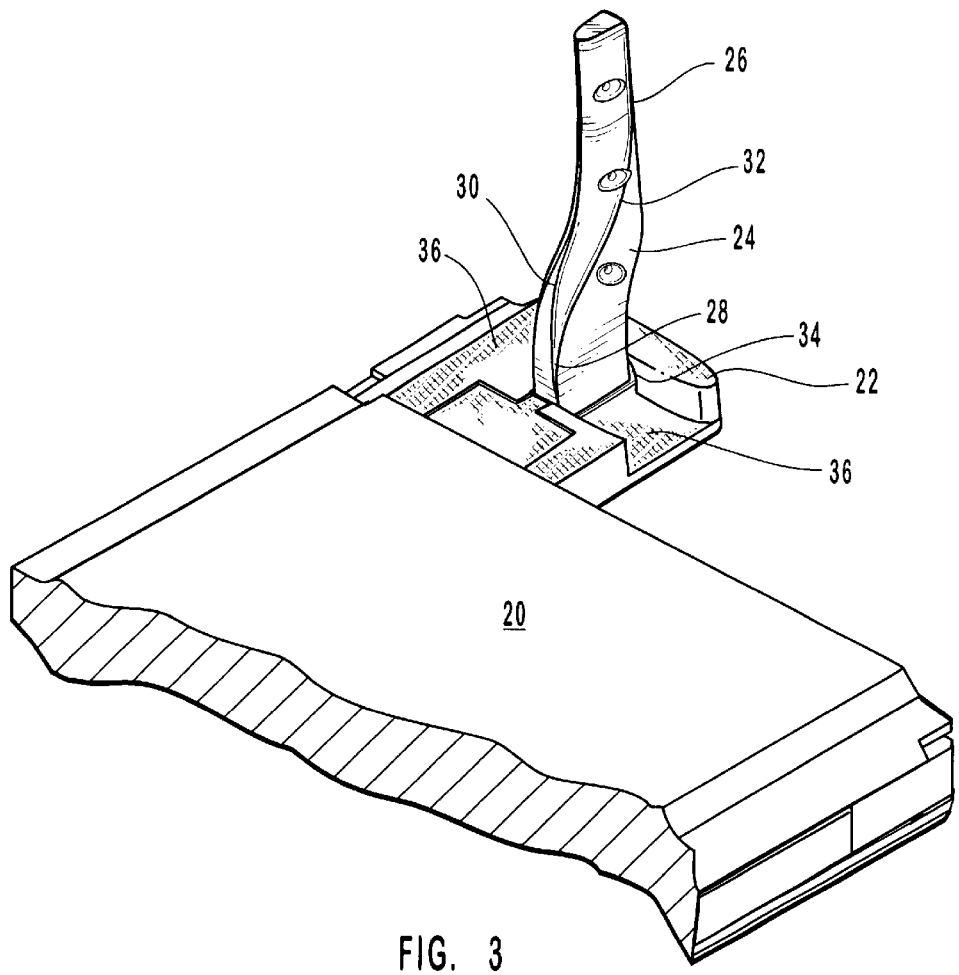
FIG. 3 is a perspective view of an embodiment of the present invention with a retractable antenna extension with hinged radiating element in a deployed position showing a reverse curved radiating element.

A preferred embodiment of the present invention is shown in FIG. 3 where a wireless electronic device 20 contains a retractable extension 22 having an antenna element 24 thereon. Antenna element 24 may pivot on hinge 34 from a deployed, usable position to a stowed, storage position. Extension 22 comprises one or more ground plane elements 36 which may comprise a conductive mesh material molded into or bonded to extension 22, a conductive foil layer on extension 22 or some other conductive ground plane element. Antenna element 24 comprises a radiator 26 with a novel geometric configuration. Radiator 26 emanates from extension 22 at a location that is near the center of ground plane element 36 and extends away from ground plane element 36 with initial substantially perpendicular segment 28 in an substantially vertical or perpendicular direction. Thereafter, radiator 26 bends outwardly away from device 20 with outwardly directed segment 30 which serves to increase the distance between device 20 and radiator 26 thereby reducing interference from circuitry in device 20. Radiator 26 may then be redirected toward it's initial vertical or substantially perpendicular orientation with substantially perpendicular tip segment 32. This configuration gives the shape of radiator 26 a reverse curvature when smooth curves are incorporated into the shape as shown in FIG. 3.

Figure 4:
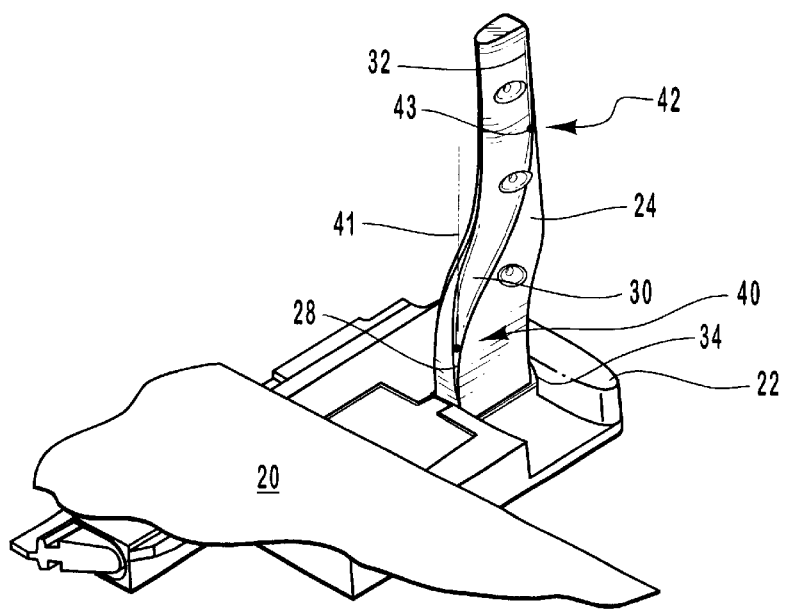
FIG. 4 is a perspective view of an embodiment of the present invention with a retractable antenna extension with hinged radiating element showing a radiating element with angular transitions.

This shape may also be achieved using abrupt angles at redirection points 40 & 42, as shown in FIG. 4 where the transition between initial perpendicular segment 28 and outwardly directed segment 30 is a first angular transition 41. Likewise, a second angular transition 43 between outwardly directed segment 30 and perpendicular tip segment 32 may be achieved with an angular transition similar to angular transition 41.

It should be noted that various shapes may be employed to achieve the geometric configuration of the present invention. Radiator segments, 28, 30 & 32 do not need to be linear between transition curves or angular transitions. Various curves, angles and other shapes may be employed to effectuate the configuration of the present invention.

This configuration allows radiator 26 to emanate from an idealized central location on ground plane 36 while tip segment 32 is located distal to host device 20 for decreased interference.

Figure 5A:
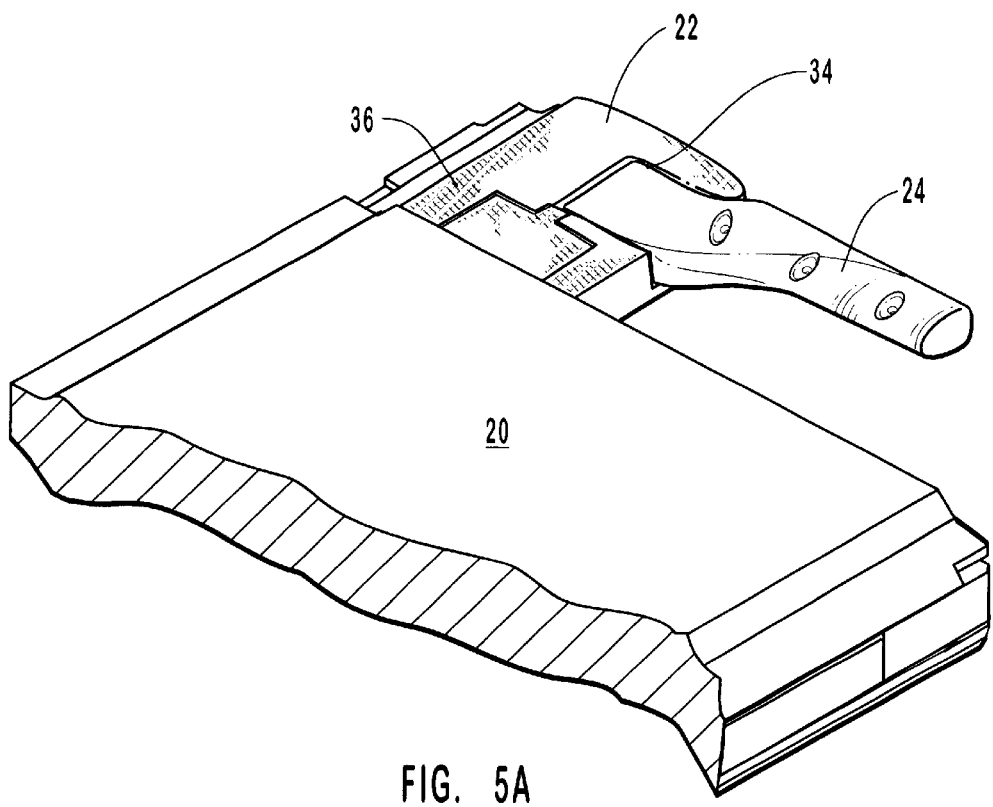
FIG. 5A is a perspective view of an embodiment of the present invention with a retractable antenna extension in an extended position and a hinged antenna element in a stowed position.

In reference to FIG. 5A, antenna element 24 may be stowed by folding along hinge 34 to align antenna element 24 with the structure of device 20 so that antenna element 24 may be retracted into device 20 for storage and protection.

Figure 5B:
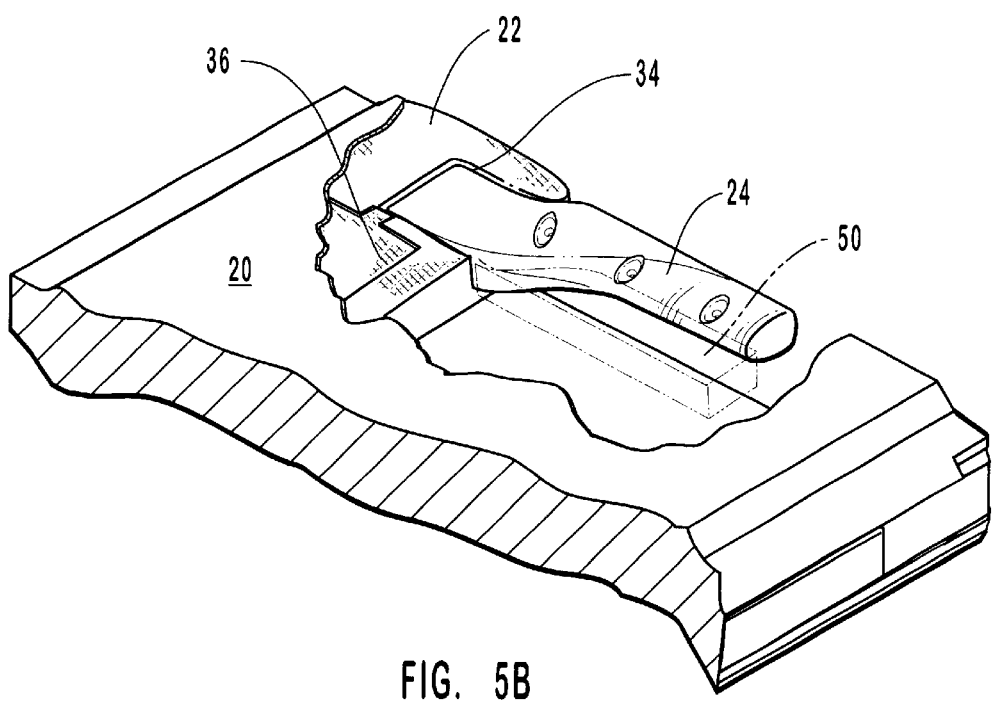
FIG. 5B is a perspective view of an embodiment of the present invention with a retractable antenna extension in a retracted position and a hinged antenna element in a stowed position.

Once antenna element 24 and extension 22 are retracted into device 20, as shown in FIG. 5B, another benefit of the geometric configuration of the present invention is realized. Antenna element 24 occupies less internal space in host device 20 when antenna element 24 bends outwardly along its length. Space 50, which would have been occupied by a straight antenna extending perpendicularly from a central location on ground plane 36, is available for population by electronic components. This additional real estate is extremely valuable in compact electronic devices, especially some PC Card standard expansion cards or other devices with restrictive form factors. Therefore, the geometric configuration of the present invention also serves to increase available space inside an electronic device thereby allowing for additional electronic components and increased functionality.

Figure 6:
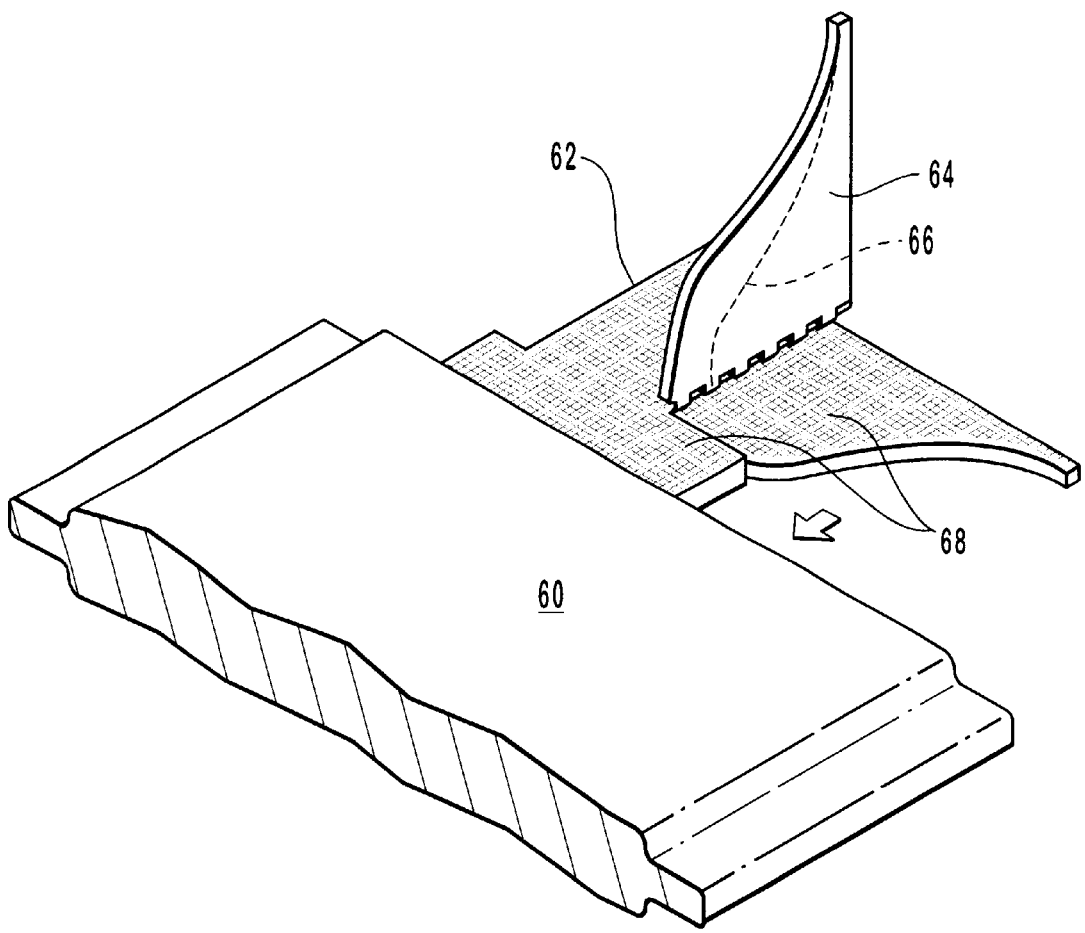
FIG. 6 is a perspective view of an alternative embodiment of the present invention with a retractable antenna extension with hinged radiating element in a deployed position.

One embodiment of the present invention, as shown in FIG. 6 may comprise a thin proile device 60 such as a PC Card standard expansion card or similar device. This embodiment comprises a retractable extension 62 with a fin-shaped, hinged antenna 64 thereon. Fin-shaped antenna 64 comprises a radiator 66 shaped in a reverse-curved configuration. Extension 62 further comprises a ground plane element 68. Radiator 66 emanates from a central location on ground plane element 68 so as to improve antenna performance.

Impedance matching circuitry and switching circuitry may also be located within the antenna element, extension, other elements or on the host device.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

We claim:

1. A wireless electronic communication apparatus comprising:
   an antenna ground plane;
   an antenna radiator, said radiator having a base section protruding substantially perpendicularly from said ground plane at a substantially centralized position on said ground plane, said radiator also having an outwardly directed section extending away from said apparatus and a tip section directed back toward a substantially perpendicular direction relative to said ground plane.

2. The electronic apparatus of claim 1 wherein said antenna ground plane and said antenna radiator are comprised in a retractable extension of said apparatus.

3. The electronic apparatus of claim 1 wherein said radiator is deployable from a stowed position when not in use to a deployed position for improved performance while in use.

4. The electronic apparatus of claim 3 wherein said antenna is deployed by hinging upward.

5. The electronic apparatus of claim 3 wherein said antenna is deployed by hinging from a substantially horizontal position to a substantially vertical position.

6. The electronic apparatus of claim 3 further comprising a wireless device and wherein deployment of said antenna activates said wireless device.

7. The electronic apparatus of claim 3 wherein deployment of said antenna radiator activates a function of said wireless electronic apparatus.

8. The electronic apparatus of claim 1 wherein said outwardly directed section comprises a reverse curvature of said radiator which bends outward away from said apparatus and then upwardly.

9. The electronic apparatus of claim 1 wherein said apparatus is an expansion card.

10. The electronic apparatus of claim 1 wherein said apparatus is a PC Card standard expansion card.

11. The electronic apparatus of claim 1 wherein said antenna is a monopole antenna.

12. An antenna for a small, wireless, electronic apparatus comprising:

a ground plane element; and a radiating element, said radiating element having a shape which initially extends substantially perpendicularly from said ground plane element at a position that is substantially central to said ground plane element, said shape then making a first change of orientation to a direction pointing away from said apparatus.

13. The antenna of claim 12 wherein said radiating element shape further changes orientation back toward a substantially perpendicular direction relative to said ground plane element.

14. The antenna of claim 12 wherein said antenna is a monopole antenna.

15. A retractable extension for a wireless electronic apparatus comprising:

a ground plane element;

an antenna radiator element which protrudes from a substantially centralized location on said ground plane and bends outwardly away from said apparatus.

16. The apparatus of claim 15 wherein said antenna radiator is hinged so that it may be folded from an upright position while in use to a more compact position for storage.

17. The apparatus of claim 15 wherein said extension will fit within a PC Card standard expansion card.

* * * * *